US008962368B2

(12) United States Patent
Wang

(10) Patent No.: US 8,962,368 B2
(45) Date of Patent: Feb. 24, 2015

(54) CMOS COMPATIBLE MEMS MICROPHONE AND METHOD FOR MANUFACTURING THE SAME

(71) Applicant: Zhe Wang, Singapore (SG)

(72) Inventor: Zhe Wang, Singapore (SG)

(73) Assignee: Goertek, Inc., Weifang, Shandong (CN)

( * ) Notice: Subject to any disclaimer, the term of this patent is extended or adjusted under 35 U.S.C. 154(b) by 63 days.

(21) Appl. No.: 13/949,519

(22) Filed: Jul. 24, 2013

(65) Prior Publication Data

US 2015/0031160 A1 Jan. 29, 2015

(51) Int. Cl.

| | |
|---|---|
| ***H01L 21/00*** | (2006.01) |
| ***B81C 1/00*** | (2006.01) |
| ***H04R 31/00*** | (2006.01) |

(52) U.S. Cl.

CPC ............ *B81C 1/00158* (2013.01); *H04R 31/00* (2013.01)

USPC ...................... 438/53; 438/200; 257/E21.573

(58) Field of Classification Search

USPC ........................ 257/E21.4, E21.533, E21.534

See application file for complete search history.

(56) References Cited

U.S. PATENT DOCUMENTS 7,346,178 B2 * 3/2008 Zhe et al. ...................... 381/174

* cited by examiner

*Primary Examiner* — Cheung Lee

(74) *Attorney, Agent, or Firm* — Troutman Sanders LLP

(57) ABSTRACT

The present invention relates to a CMOS compatible MEMS microphone, comprising: an SOI substrate, wherein a CMOS circuitry is accommodated on its silicon device layer; a microphone diaphragm formed with a part of the silicon device layer, wherein the microphone diaphragm is doped to become conductive; a microphone backplate including CMOS passivation layers with a metal layer sandwiched and a plurality of through holes, provided above the silicon device layer, wherein the plurality of through holes are formed in the portions thereof opposite to the microphone diaphragm, and the metal layer forms an electrode plate of the backplate; a plurality of dimples protruding from the lower surface of the microphone backplate opposite to the diaphragm; and an air gap, provided between the diaphragm and the microphone backplate, wherein a spacer forming a boundary of the air gap is provided outside of the diaphragm or on the edge of the diaphragm.

5 Claims, 9 Drawing Sheets

CMOS COMPATIBLE MEMS MICROPHONE AND METHOD FOR MANUFACTURING THE SAME

This application is a Divisional of U.S. application Ser. No. 13/581,499 filed Aug. 28, 2012 which is a US National Stage of International Application No. PCT/CN2010/075514 filed 28 Jul. 2010.

FIELD OF THE INVENTION

The present invention relates to the field of microphone technology, and more specifically, to a CMOS compatible MEMS microphone and a method for manufacturing the same.

BACKGROUND

The silicon based MEMS microphone, also known as an acoustic transducer, has been in research and development for many years. Because of its potential advantages in miniaturization, performance, reliability, environmental endurance, costs and mass production capability, the silicon based MEMS microphone is widely used in many applications, such as cell phones, hearing aids, smart toys and surveillance devices.

In general, a silicon based MEMS microphone consists of four elements: a fixed backplate, a highly compliant, moveable diaphragm (which together form the two plates of a variable air-gap condenser), a voltage bias source and a buffer. The two mechanical elements, the backplate and the diaphragm, are typically formed on a single silicon substrate. One of these two elements is generally formed to be planar with the surface of the supporting silicon wafer, and the other element, while itself generally planar, is supported several microns above the first element by spacer or sidewalls.

Patent application No. WO 02/15636 discloses an acoustic transducer. The acoustic transducer has a diaphragm positioned between a cover member and a substrate, and the diaphragm can be laterally movable within a plane parallel to the planar surface of the cover member, as shown in FIG. 1 of WO 02/15636. The floating diaphragm is free to move in its own plane, and thus can release its intrinsic stress, resulting very consistent mechanical compliance. However, this kind of "floating" diaphragm is required to be made of lower stress polysilicon, and the structure formation process is not compatible with CMOS process.

U.S. Pat. No. 7,346,178 discloses a microphone sensing element without dedicated backplate component. In the microphone sensing element, a movable diaphragm is supported at its edges or corners by mechanical springs that are anchored to a conductive substrate through rigid pads, as shown in FIGS. 1 and 2 of U.S. Pat. No. 7,346,178. In U.S. Pat. No. 7,346,178, the structure of the microphone sensing element is very simple, however, the diaphragm is required to be made of low stress polysilicon, and the substrate is required to be a low resistivity substrate, which is a standard substrate for formation of CMOS circuitry.

Patent document PCT/DE97/02740 discloses a miniaturized microphone. In the miniaturized microphone, an SOI substrate is used for formation of CMOS and the microphone backplate. However, the diaphragm is a polysilicon thin film formed in CMOS fabrication. Such a poly diaphragm normally has very high intrinsic stress which is difficult to control, thus resulting in unconsistent mechanical compliance.

U.S. Pat. No. 6,677,176 discloses a method for forming an integrated semiconductor device including a microphone and at least one MOSFET sensing transistor. In this method, the structure can be formed using CMOS thin films. However, it is difficult to control the intrinsic stress in CMOS thin films which may affect the device functionality and manufacturing yield.

In summary, most of prior arts are either incompatible with CMOS process or their structures have various inherent shortcomings in manufacturability.

Therefore, there is a need for a CMOS compatible MEMS microphone and method for manufacturing the same.

SUMMARY

In order to solve the above problems, the present invention provide a CMOS compatible MEMS microphone and a method for manufacturing the same, thereby make the formation of a microphone structure fully compatible with CMOS processes, and make the microphone structure insusceptible to any intrinsic stress.

Embodiments of the present invention provide a CMOS compatible MEMS microphone, including:

an SOI substrate, wherein a CMOS circuitry is accommodated on its silicon device layer;

a microphone diaphragm formed with a part of the silicon device layer, wherein the microphone diaphragm is doped to become conductive, a microphone backplate including CMOS passivation layers with a sandwiched metal layer and a plurality of through holes, provided above the silicon device layer, wherein the plurality of through holes are formed in the portions thereof opposite to the microphone diaphragm, and the metal layer forms an electrode plate of the backplate;

a plurality of dimples protruding from the lower surface of the microphone backplate opposite to the diaphragm, and an air gap provided between the diaphragm and the microphone backplate, wherein a spacer forming a boundary of the air gap is provided outside of the diaphragm or on the edge of the diaphragm, wherein a back hole is formed to be open in substrate underneath the diaphragm so as to allow sound pass through, and the microphone diaphragm is used as an electrode plate to form a variable capacitive sensing element with the electrode plate of the microphone backplate.

Further, embodiments of the present invention provide a method for manufacturing a CMOS compatible MEMS microphone, including:

forming a microphone diaphragm by patterning the silicon device layer of an SOI substrate and doping the microphone diaphragm so as to make the microphone diaphragm conductive;

forming a CMOS dielectric oxide layer on the silicon device layer and the microphone diaphragm;

forming a plurality of deep trenches and a plurality of shallow trenches in the CMOS dielectric oxide layer, wherein the deep trenches are formed vertically from the upper surface of the CMOS dielectric oxide layer to the upper surface of the silicon device layer, the shallow trenches are formed vertically from the upper surface of the CMOS dielectric oxide layer, opposite to the microphone diaphragm, to a certain depth of the CMOS dielectric oxide layer;

forming isolation walls and a plurality of dimples by depositing a CMOS passivation layer into the trenches;

forming a microphone backplate on the CMOS dielectric oxide layer, by sequentially depositing a CMOS passivation layer, a metal layer and a CMOS passivation layer, with a plurality of through holes formed in the portion of the microphone backplate opposite to the microphone diaphragm;

forming a back hole by removing the portion of the SOI substrate underneath the microphone diaphragm; and forming an air gap by removing the CMOS dielectric oxide layer between the diaphragm and the backplate.

While various embodiments have been discussed in the summary above, it should be appreciated that not necessarily all embodiments include the same features and some of the features described above are not necessary but can be desirable in some embodiments. Numerous additional features, embodiments and benefits are discussed in the detailed description which follows.

BRIEF DESCRIPTION OF THE DRAWINGS

The objectives and features of the present invention will become apparent from the following description of embodiments, given in conjunction with the accompanying drawings, in which.

DETAILED DESCRIPTION

Figure 1:
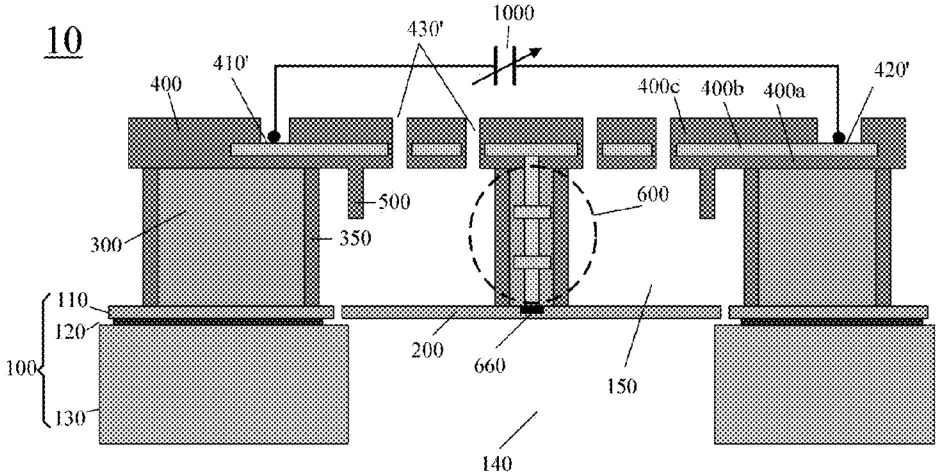
FIG. 1 is a cross-sectional view showing the structure of the CMOS compatible MEMS microphone according to the first embodiment of the present invention.

Various aspects of the claimed subject matter are now described with reference to the drawings, wherein the illustrations in the drawings are schematic and not to scale, and like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects.

(The First Embodiment)

First of all, a specific structure of the CMOS compatible MEMS microphone according to the first embodiment of the present invention will be explained with reference to FIG. 1. FIG. 1 is a cross-sectional view showing the structure of the CMOS compatible MEMS microphone 10 according to the first embodiment of the present invention.

As shown in FIG. 1, the CMOS compatible MEMS microphone 10 includes: a silicon-on-insulator (SOI) substrate 100, a microphone diaphragm 200, a spacer 300, a microphone backplate 400, a plurality of dimples 500, and an interconnection column 600.

The SOI substrate 100 contains a silicon device layer 110, a buried oxide (BOX) layer 120 and a silicon substrate 130 stacked from the top down in above order. The SOI substrate 100 is opened in the silicon substrate 130 and the BOX layer 120 so as to expose the lower surface of the microphone diaphragm 200, thus forming a back hole 140.

The diaphragm 200 is made of a part of the silicon device layer 110, which is exposed by the back hole 140, and is separate from the rest part of the silicon device layer 110 that is available for accommodating CMOS circuitry. Further, as shown in FIG. 1, the diaphragm 200 is separate from the SOI substrate 100. The surface of diaphragm 200 may be either N type doped or P type doped with sheet resistance of less than 60 ohms/square, and has its central area specially doped for making good Ohmic contact with an extraction electrode, which will be explained later. The diaphragm 200 in this invention serves as not only a vibration membrane which vibrates in response to an external acoustic wave passing through the back hole 140, but also one electrode plate of a variable condenser 1000, which coverts acoustic energy into electrical energy so as to sense an acoustic wave, as will be explained later.

The spacer 300 is made of CMOS dielectric oxide, such as plasma enhanced chemical vapor deposition (PECVD) oxide, phospho-silicate-glass (PSG), or boro-phospho-silicate-glass (BPSG), and provided between the backplate 400 and the silicon device layer 110 outside the diaphragm 200, thus, there forms an air gap 150 between the backplate 400 and the diaphragm 200. The spacer 300 has a shape of a washer, and is provided with isolation walls 350, which is formed of a CMOS dielectric passivation layer such as a silicon nitride layer, on both inner and outer lateral sides thereof.

Figure 2:
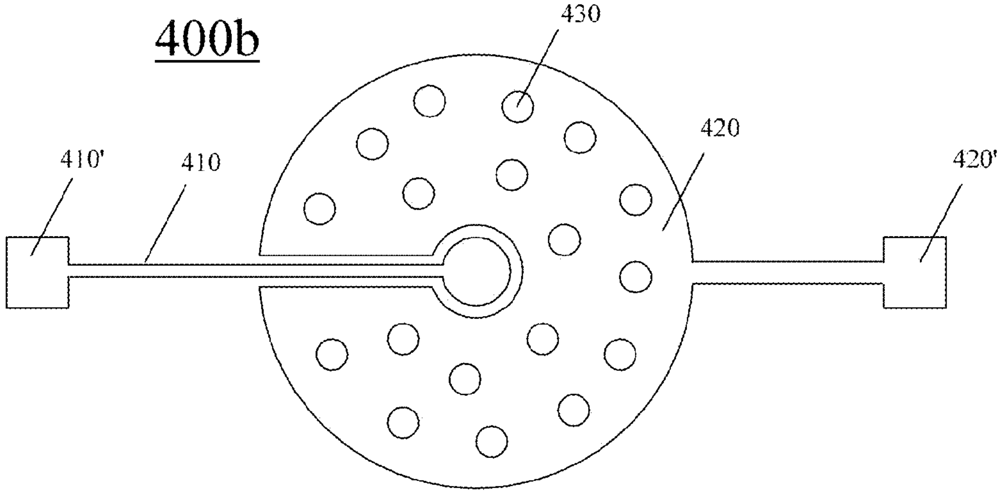
FIG. 2 is a top view showing the structure of the patterned metal layer embedded in the backplate of the CMOS compatible MEMS microphone according to the first embodiment of the present invention.

The microphone backplate 400 includes a first CMOS dielectric passivation layer 400*a*, a patterned metal layer 400*b* and a second CMOS dielectric passivation layer 400*c*, with the patterned metal layer 400*b* sandwiched between the two CMOS dielectric passivation layers, and is provided on the spacer 300. The sandwiched metal layer 400*b* can be isolated from external corrosive gases in the air and also can avoid any electrical leakage between the backplate 400 and the diaphragm 200 in humid environment. FIG. 2 is a top view showing the structure of the patterned metal layer 400*b* embedded in the backplate 400. As shown in FIG. 2, the patterned metal layer 400*b* can be divided into an extraction electrode 410 of the diaphragm 200 and a backplate electrode 420, which are separated from each other. The backplate electrode 420 roughly has a circular shape with a hub area and a spoke area left for receiving the extraction electrode 410 that is electrically connected to the diaphragm 200 via the interconnection column 600, as described later. Also the backplate electrode 420 is provided with a plurality of through holes 430 in the portion opposite to the diaphragm 200. The backplate electrode 420 forms the other electrode plate of the variable condenser 1000, which is directly opposite to the one electrode plate of the condenser 1000, i.e. the diaphragm 200. Also, there are provided a plurality of through holes 430' on the backplate 400, which correspond to the through holes 430 on the backplate electrode 420 and are used for passing air so as to reduce air resistance that the diaphragm 200 will encounter when starts vibrating.

The plurality of dimples 500 are configured on the lower surface of the backplate 400, and protruded vertically therefrom into the air gap 150 between the backplate 400 and the diaphragm 200 without touching the upper surface of the diaphragm 200. The dimples 500 are formed to prevent the diaphragm 200 from sticking to the backplate 400 caused either by surface tension during the formation, i. e. the wet release process (described later), or by sound pressure and electrostatic force during the operation. It should be noted that the ends of the dimples 500 and the upper surface of diaphragms 200 may come into touch sporadically due to, for example, a sound pressure and an electrostatic force, but will stay apart under the effect of an inherent resilient force of the structure. Thus, the diaphragm 200 will never collapse onto the backplate 400 to cause a short circuit therebetween or a failure of the structure.

Figure 3:
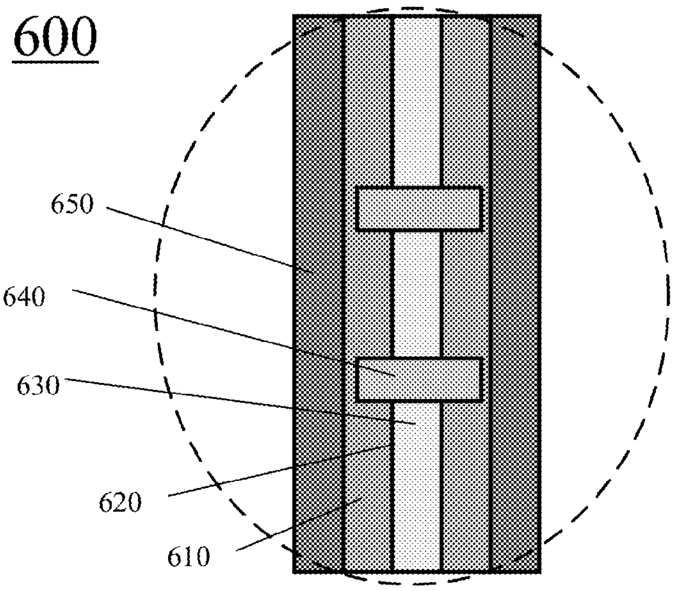
FIG. 3 is an enlarged view showing the structure of the interconnection column 600 of FIG. 1.

The interconnection column 600 contains a plurality of electrically interconnected units stacked one on top of another and vertically aligned. FIG. 3 is an enlarged view showing the structure of the interconnection column 600 of FIG. 1. As shown in FIG. 3, each interconnected unit comprises a CMOS dielectric oxide layer 610 and a via hole 620 opened therein, wherein the via hole 620 is filled with a first metal 630 such as aluminum, titanium, copper and so on, the first metal 630 is flattened by so called chemical mechanical polishing (CMP) machine and a same or different second metal 640 such as aluminum, titanium copper and so forth is deposited on the top. Furthermore, the interconnection column 600 is provided with isolation walls 650, which are formed of a CMOS dielectric passivation layer such as a silicon nitride layer, on the outer lateral sides thereof. The upper side of the interconnection column 600 is combined to the lower surface of the backplate 400, and is electrically connected to the extraction electrode 410 of the diaphragm 200, which is embedded in the backplate 400, while the lower side of the interconnection column 600 is combined to the upper surface of the central portion of the diaphragm 200, and forms ohmic contact 660 therewith. Therefore, the diaphragm 200, center-constrained by the interconnection column 600 and doped to become electrically conductive, and the backplate electrode 420 form a variable condenser 1000, the distance therebetween will change in response to a sound pressure, resulting in a varying capacitance, which can be sensed by external electronic circuits so as to achieve the conversion of acoustic signals into electrical signals.

Hence, there is provided a CMOS compatible MEMS microphone which utilizes a silicon device layer of a SOI substrate to form a vibrating diaphragm, and has the vibration diaphragm center-constrained by an interconnection column so as to keep the diaphragm separate from the SOI substrate and thus insusceptible to any intrinsic stress, and electrically connected to an extraction electrode. In comparison with the prior art, the present invention adopts a ready-made and stress free silicon layer instead of a low-stress polysilicon film to form a vibration diaphragm, thus simplifies the processing, improves the performance and manufacturing yield of the MEMS microphone of the present invention.

Hereinafter, a method of manufacturing the CMOS compatible MEMS microphone according to the first embodiment of the present invention will be described with reference to FIG. 4A through FIG. 4K. FIG. 4A through FIG. 4K are cross-sectional views showing a method of manufacturing the CMOS compatible MEMS microphone according to the first embodiment of the present invention. In the following description, for sake of clarity and conciseness, a lot of processing details, such as equipments, conditions, parameters and so on, are omitted in considering that they are well known by those skilled in the art.

Figure 4A:
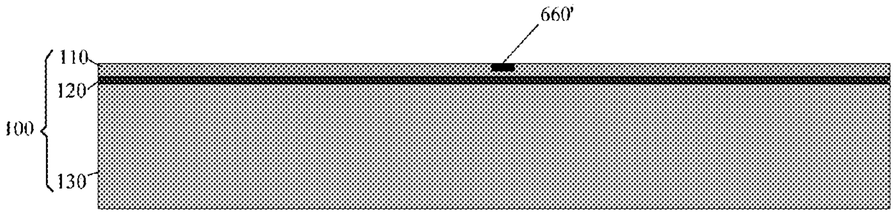
FIG. 4A through FIG. 4K are cross-sectional views showing a method of manufacturing the CMOS compatible MEMS microphone according to the first embodiment of the present invention.

In Step S401, As shown in FIG. 4A, first of all, prepare an SOI substrate 100, which contains a silicon device layer 110, a buried oxide layer 120 and a silicon substrate 130 stacked from the top down in above order. Preferably, the silicon device layer 110 may, in advance, be either N type doped or P type doped with sheet resistance of less than 60 ohms/square, but not limited thereto. Then, an area of the silicon device layer 110 is selectively implanted with boronic ions, Arsenic ions or Phosphorous ions and so on, and the implants are annealed to get activated, so as to form an ohmic contact area 660'.

Figure 4B:
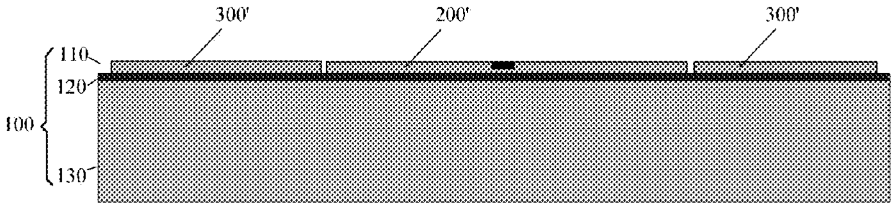

In Step S403, as shown in FIG. 4B, the silicon device layer 110 is patterned, by lithography and reactive ion etching (RIE), to define a microphone diaphragm area 200' and a spacer area 300'.

Figure 4C:
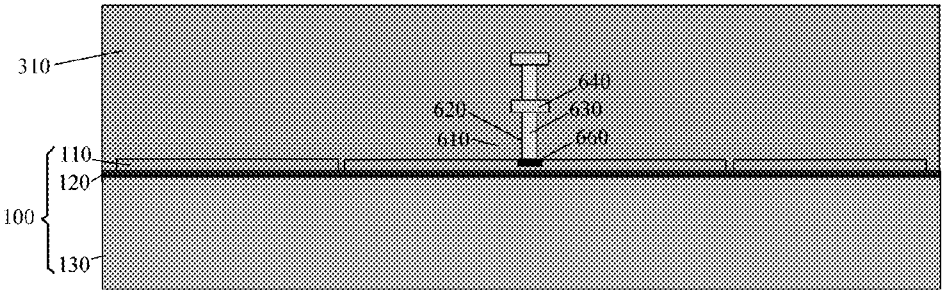

In Step S405, as shown in FIG. 4C, a CMOS dielectric oxide layer 610, such as a layer of PECVD oxide, PSG, BPSG or a combination of these oxide layers, is deposited on the patterned silicon device layer 110. Then, a via hole 620 is formed in the CMOS dielectric oxide layer 610 just above the ohmic contact area 660'. A first metal 630, such as copper, aluminum, titanium and so on, is then deposited in the via hole 620 to form a good ohmic contact 660 with the ohmic contact area 660' of the silicon device layer 110. The CMOS dielectric oxide layer 610 and the first metal 630 are then flattened by a CMP machine, and on the flattened surface thereof, a same or different second metal 640 such as copper, aluminum, titanium and so forth is deposited. The procedure of depositing a CMOS dielectric oxide layer 610, opening a via hole 620 therein, filling a first metal 630, flattening the surface thereof, and forming a second metal 640 can be repeated a plurality of times, typically three times, during the manufacture of the MEMS microphone and the formation of peripheral electronic circuits. Finally, there is formed a heavy layer 310 of CMOS dielectric oxide with a stack of via hole-first metal-second metal units embedded therein and aligned on the ohmic contact 660, as shown in FIG. 4C.

Figure 4D:
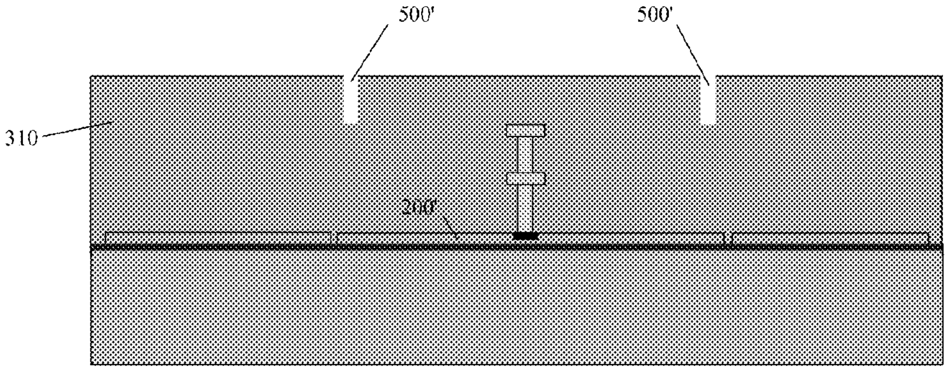

In Step S407, as shown in FIG. 4D, there are formed a plurality of shallow trenches 500', extending from the upper surface of the CMOS dielectric oxide layer 310 down to a certain depth (for example half way) above the diaphragm area 200'. The plurality of shallow trenches 500' are used to form a plurality of dimples 500, as described later.

Figure 4E:
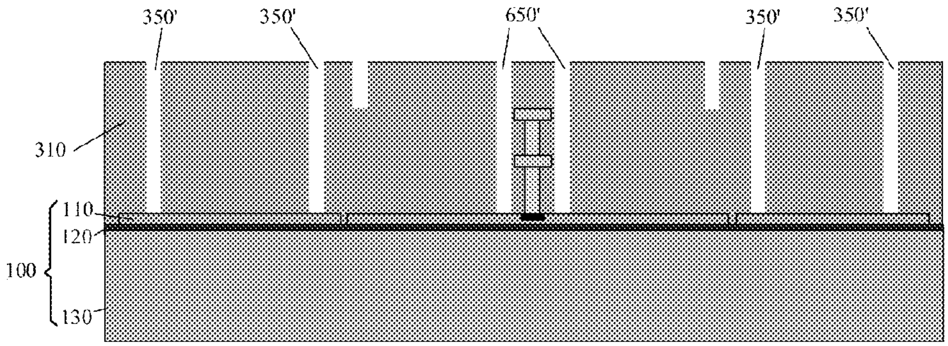

In Step S409, as shown in FIG. 4E, there are formed a plurality of deep trenches 350' and 650', extending from the upper surface of the CMOS dielectric oxide layer 310 down all the way to the upper surface of the silicon device layer 110. The plurality of deep trenches 350' and 650' are configured such that they define the spacer 300 and the interconnection column 600 respectively, and at the same time leave a space for forming isolation walls 350 and 650 around the same.

Figure 4F:
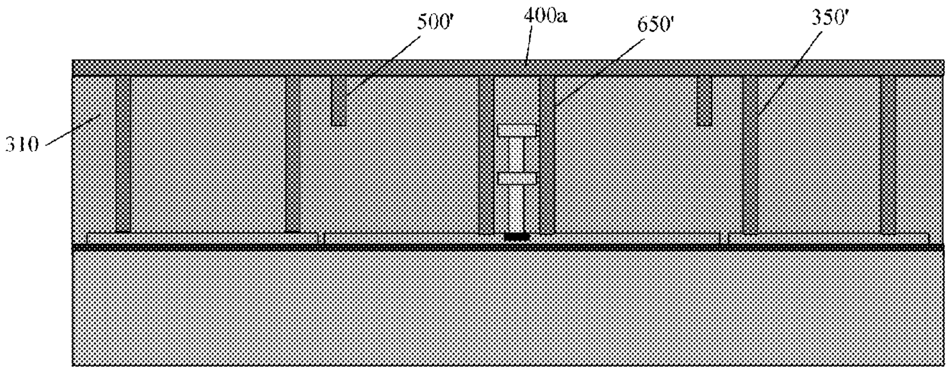

In Step S411, as shown in FIG. 4F, on the CMOS dielectric oxide layers 310, there is deposited a first CMOS dielectric passivation layer 400*a*, such as a layer of PECVD SiN, which fills both the shallow trenches 500' and the deep trenches 350', 650' and covers the surface of the CMOS dielectric oxide layer 310.

Figure 4G:
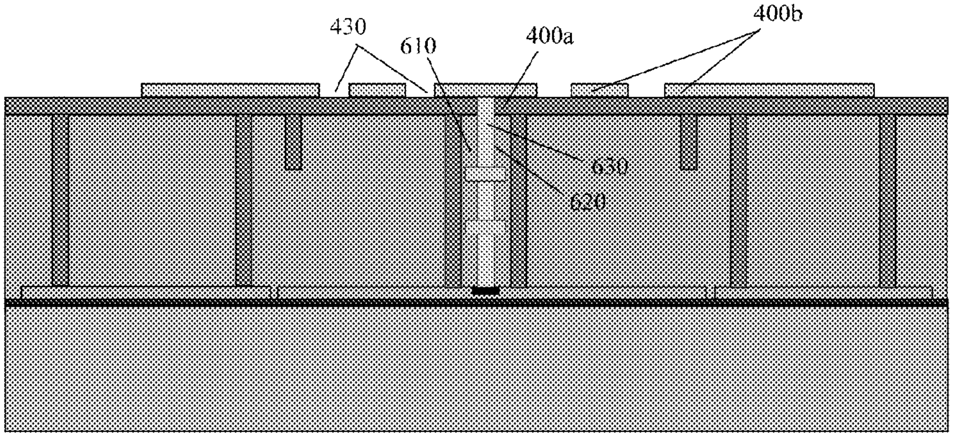

In Step S413, as shown in FIG. 4G, a via hole 620 is opened in the first CMOS dielectric passivation layer 400*a* and the CMOS dielectric oxide layer 610 just above the stack of via hole-first metal-second metal units described above in Step S430. Then, a first metal 630, such as copper, aluminum, titanium and so on, is filled in the via hole 620. Thereafter, a patterned metal layer 400*b*, comprising the extraction electrode 410 of the diaphragm 200 and a backplate electrode 420 as shown in FIG. 2, is formed on the surface of the first CMOS dielectric passivation layer 400*a* with its central portion electrically connected to the stack of via hole-first metal-second metal units described above and with the backplate electrode 420 provided with a plurality of through holes 430 thereon. The metal layer 400*b* may be deposited with a metal such as copper, aluminum, titanium and so on.

Figure 4H:
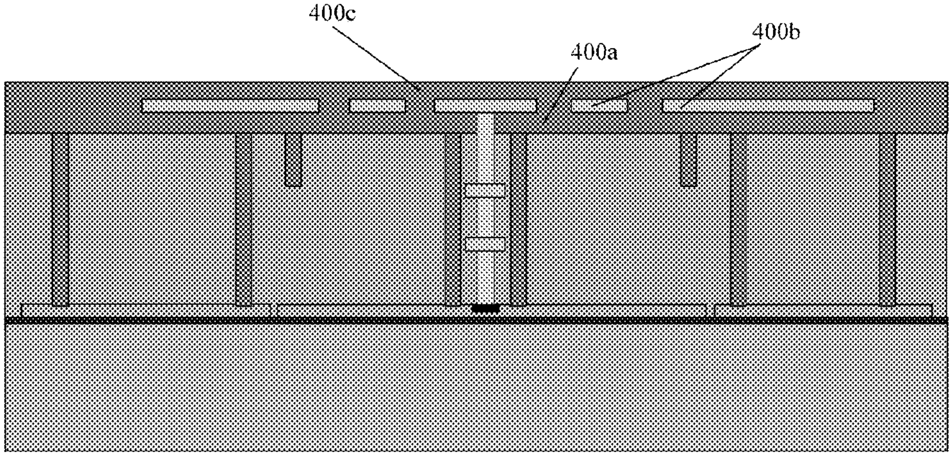
Figure 4I:
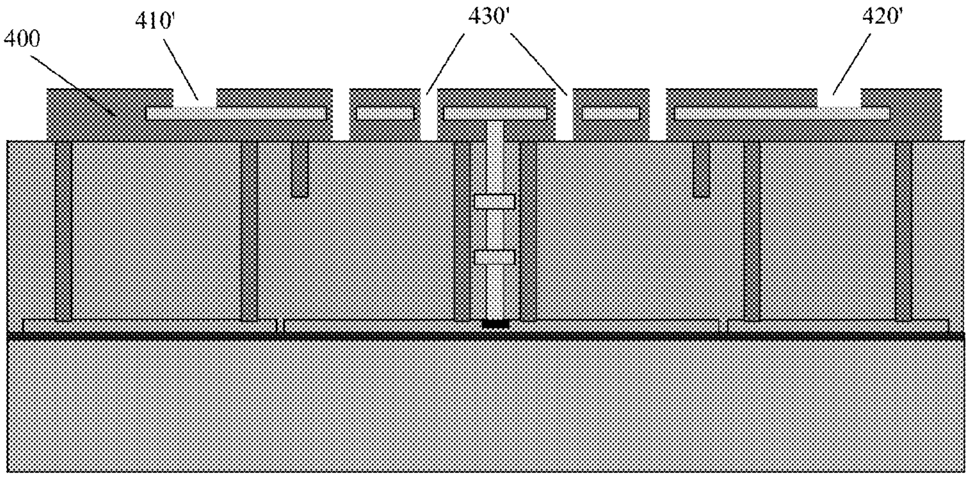

In Step S415, as shown in FIG. 4H, a second CMOS dielectric passivation layer 400*c*, such as a layer of PECVD SiN, is deposited on the metal layer 400*b* and the first CMOS dielectric passivation layer 400*a* so that the patterned metal layer 400*b* is sandwiched between the two CMOS dielectric passivation layers 400*a*, 400*c*.

In Step S417, as shown in FIG. 41, a CMOS dielectric passivation layer is etched using RIE to form through holes 430' on the backplate 400, which are aligned to the through holes 430 on the metal layer 400*b*, and to expose the extraction electrode pad 410' of the diaphragm 200 and a backplate electrode pad 420'.

Figure 4J:
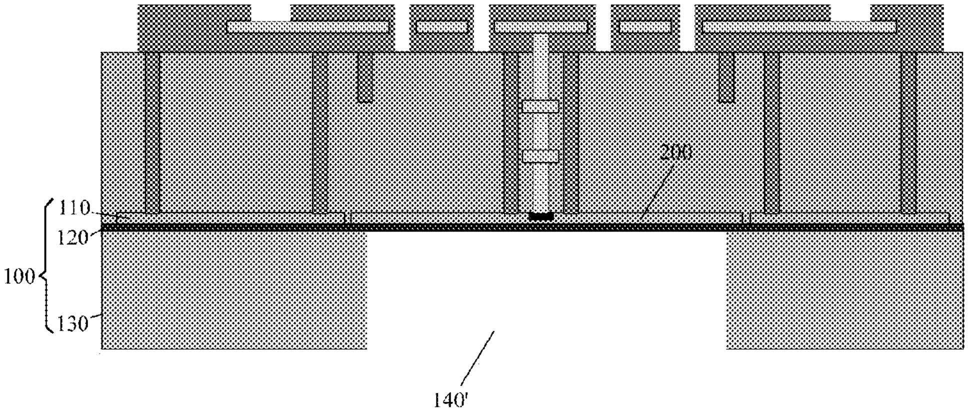

In Step S419, as shown in FIG. 4J, a back hole 140' is etched, by Si Deep Reactive Ion Etching (DRIE) or Wet Etching, in the silicon substrate 130 of the SOI substrate 100 till the lower surface of the buried oxide layer 120 underneath the diaphragm 200 is exposed.

Figure 4K:
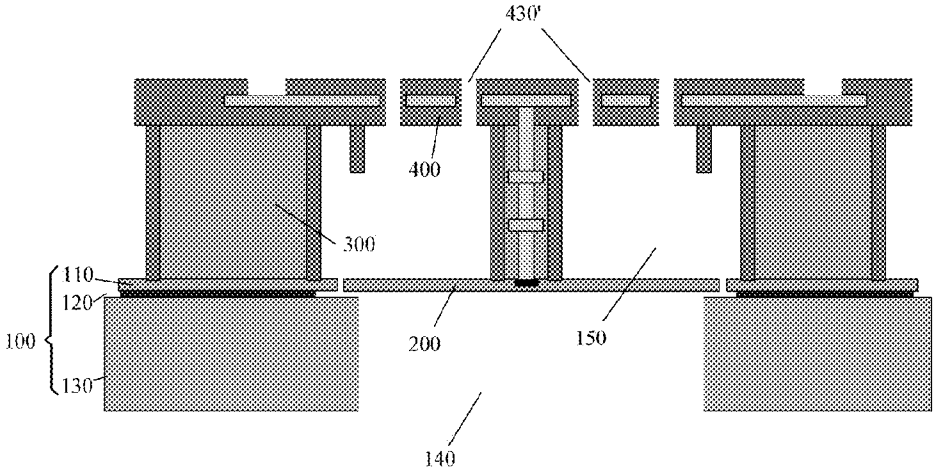

In Step S421, as shown in FIG. 4K, a sacrificial oxide layer above the diaphragm 200 and the buried oxide layer 120 underneath the diaphragm 200 are removed by wet etching. During the wet etching, a HF based solution may permeate, through the holes 430' on the backplate 400, into the space defined by the lower surface of the backplate 400, the inner surface of the spacer 300 and the upper surface of the diaphragm 200, and thus remove the sacrificial oxide layer confined therein and form an air gap 150. In this way, the diaphragm 200 is separate from the SOI substrate 100.

Hitherto, there is provided a method of manufacturing the CMOS compatible MEMS microphone according to the first embodiment of the present invention. As can be seen from the above described processing, the method is fully compatible with the standard CMOS processing, thus helps to further improve the performance and manufacturing yield of the MEMS microphone of the present invention.

(The Second Embodiment)

Figure 5:
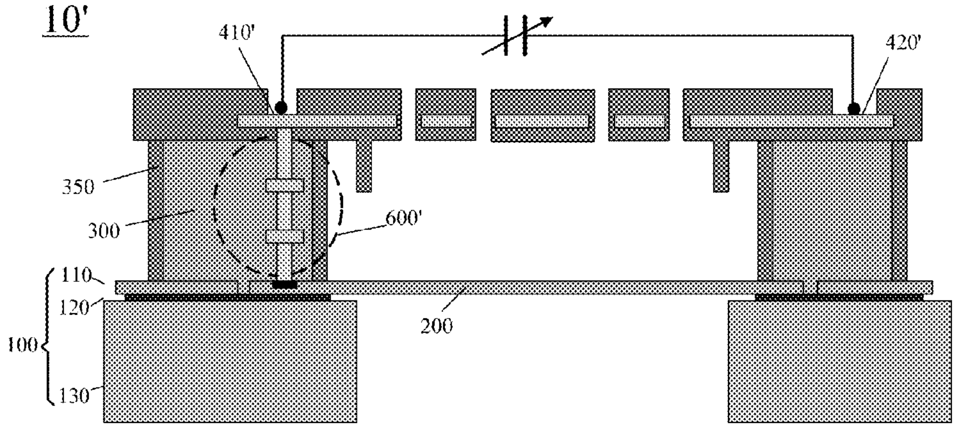
FIG. 5 is a cross-sectional view showing the structure of the CMOS compatible MEMS microphone according to the second embodiment of the present invention.

Now, the specific structure of the CMOS compatible MEMS microphone according to the second embodiment of the present invention will be explained with reference to FIG. 5. FIG. 5 is a cross-sectional view showing the structure of the CMOS compatible MEMS microphone 10' according to the second embodiment of the present invention. Comparing FIG. 5 with FIG. 1, the second embodiment of the present invention is distinguished from the first one in that, in the second embodiment, the interconnection column 600' is designed to be provided on edge of the diaphragm 200.

Correspondingly, in the second embodiment, the diaphragm 200 is not separate from the SOI substrate 100, i.e. the edge portion of the diaphragm 200 is anchored. Thus, it is preferable that the intrinsic stress of the ready-made silicon device layer 110 of the SOI substrate 100 is small, so that the performance of the diaphragm 200 is less affected.

Also, in the second embodiment, it is unnecessary to form an isolation wall 650 around the interconnection column 600', since the interconnection column 600' is embedded in the spacer 300 which is provided with isolation walls 350.

Furthermore, in the second embodiment, the extraction electrode 410 of the diaphragm 200 and the backplate electrode 420 do not have to be inter-crossed.

The method of manufacturing the CMOS compatible MEMS microphone according to the second embodiment of the present invention is similar to that of the first embodiment, hence, the detailed description thereof is omitted.

It should be noted that a circular shape for the CMOS compatible MEMS microphone is normally preferred, but other shapes like square, rectangular or other polygonal shapes are possible.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A method for manufacturing a CMOS compatible MEMS microphone, comprising:

forming a microphone diaphragm by patterning the silicon device layer of an SOI substrate and doping the microphone diaphragm so as to make the microphone diaphragm conductive;

forming a CMOS dielectric oxide layer on the silicon device layer and the microphone diaphragm;

forming a plurality of deep trenches and a plurality of shallow trenches in the CMOS dielectric oxide layer, wherein the deep trenches are formed vertically from the upper surface of the CMOS dielectric oxide layer to the upper surface of the silicon device layer, the shallow trenches are formed vertically from the upper surface of the CMOS dielectric oxide layer, opposite to the microphone diaphragm, to a certain depth of the CMOS dielectric oxide layer;

forming isolation walls and a plurality of dimples by depositing a CMOS passivation layer into the trenches;

forming a microphone backplate on the CMOS dielectric oxide layer, by sequentially depositing a CMOS passivation layer, a metal layer and a CMOS passivation layer, with a plurality of through holes formed in the portion of the microphone backplate opposite to the microphone diaphragm;

forming a back hole by removing the portion of the SOI substrate underneath the microphone diaphragm; and forming an air gap by removing the CMOS dielectric oxide layer other than the portions of the CMOS dielectric oxide layer confined by the plurality of deep trenches.

2. The method of claim 1, wherein the step of forming a CMOS dielectric oxide layer further comprising:

forming a plurality of CMOS dielectric oxide layers on the silicon device layer and the microphone diaphragm, wherein a metal interconnection column is formed in the portion of CMOS dielectric oxide layers above the microphone diaphragm, during forming the plurality of CMOS dielectric oxide layers, the metal interconnection column is formed with CMOS dielectric silicon oxide layers, vias and CMOS metal layers.

3. The method of claim 2, wherein the metal interconnection column is provided on the center of the microphone diaphragm.

4. The method of claim 3, wherein the microphone diaphragm is separate from other parts of the silicon device layer.

5. The method of claim 2, wherein the metal interconnection column is provided on one edge of the microphone diaphragm.

* * * * *